United States Patent [19]
Chong

[11] Patent Number: 6,075,421
[45] Date of Patent: Jun. 13, 2000

[54] VOLTAGE CONTROLLED OSCILLATOR

[75] Inventor: Chee Khon Chong, Penang, Malaysia

[73] Assignee: Motorola, Inc., Schaumburg, Ill.

[21] Appl. No.: 09/016,781

[22] Filed: Jan. 30, 1998

[51] Int. Cl.[7] .................................... H03B 5/12
[52] U.S. Cl. ................... 331/117 R; 331/177 V; 331/175; 331/167; 331/108 R; 331/179
[58] Field of Search .......................... 331/177 V, 117 R, 331/175, 179, 34, 36 C, 108 R, 167, 36 L; 455/260, 262, 318; 332/138, 141

[56] References Cited

U.S. PATENT DOCUMENTS

| | | | |
|---|---|---|---|
| 4,661,785 | 4/1987 | Benjaminson | 331/109 |
| 5,565,821 | 10/1996 | Murtojarvi | 331/117 D |
| 5,900,788 | 12/1997 | Hagemeyer | 331/117 R |

*Primary Examiner*—Arnold Kinkead
*Attorney, Agent, or Firm*—Dale W. Dorinski

[57] ABSTRACT

A voltage controlled oscillator (1) comprising a voltage controllable variable resonant circuit (2) having a control input (Vctrl), a positive feedback input (6) and a controllable variable frequency output (7). The voltage controlled oscillator (1) also has an amplifier (3) having an amplifier input coupled to the controllable variable frequency output (7) and an oscillator output (Out). A positive feedback path (4) couples the amplifier (3) to the a positive feedback input (6) and a frequency dependent negative feedback path (5) provides increased negative feedback to the amplifier (3) as the Radio Frequency increases.

9 Claims, 2 Drawing Sheets

6,075,421

VOLTAGE CONTROLLED OSCILLATOR

FIELD OF THE INVENTION

This invention relates to a voltage controlled oscillator comprising a frequency dependent negative feedback path. The invention is particularly useful for, but not necessarily limited to, improving bandwidth characteristics of, for example, conventional Hartley configuration voltage controlled oscillators.

BACKGROUND ART

Voltage controlled oscillators have been used in the communications industry typically for portable radios, portable telephones and pagers. However, the bandwidth of prior art voltage controlled oscillators may not be sufficient for certain applications. For example, in U.S. Pat. No. 4,450,416 a wideband voltage controlled oscillator is described which has a resonant circuit comprising varactors, an inductor and capacitor. A control voltage is applied to cathodes of the varactors to alter their capacitance. Accordingly, the frequency of the voltage controlled oscillator can be controlled by varying the control voltage. One problem with this oscillator is that it requires a relatively small value of capacitance in the resonant circuit which is therefore a limitation on bandwidth.

Disclosed in U.S. Pat. No. 5,144,264 is an open loop gain compensated wideband Colpitts voltage controlled oscillator having a direct current drain that is flatter than other prior art Colpitts voltage controlled oscillators. However, the bandwidth of this wideband voltage controlled oscillator may not be sufficient for all applications.

Hartley wideband voltage controlled oscillators are often used to obtain a wider bandwidth coverage than is achievable by Colpitts voltage controlled oscillators. One disadvantage with conventional Hartley wideband voltage controlled oscillators is that the direct current drain decreases with frequency. This decrease in direct current drain can affect phase noise performance which is undesirable for certain applications.

Unfortunately, one significant problem of prior art radio frequency wideband voltage controlled oscillators is that they do not provide for a relatively constant SideBand Noise Ratio (SBNR) across their bandwidth and therefore this may affect selectivity of adjacent channels.

SUMMARY OF THE INVENTION

It is an object of the present invention to overcome or alleviate at least one of the problems associated with radio frequency wideband voltage controlled oscillators.

According to one aspect of the invention there is provided a voltage controlled oscillator comprising:

a voltage controllable variable resonant circuit having a control input, a positive feedback input and a controllable variable frequency output;

an amplifier having an amplifier input coupled to said controllable variable frequency output, a positive feedback node, a negative feedback node and an oscillator output;

a positive feedback path coupling said positive feedback node to said positive feedback input; and a frequency dependent negative feedback path coupling said negative feedback node to said amplifier input.

Preferably, in use, said frequency dependent negative feedback path provides for an increase in negative feedback in response to an increase in frequency over a desired bandwidth of said voltage controlled oscillator.

Suitably, said frequency dependent negative feedback path has an impedance which decreases in response to an increase in frequency over a desired bandwidth of said voltage controlled oscillator.

Suitably, over the desired bandwidth of said voltage controlled oscillator said impedance is predominantly capacitive. Preferably, over the desired bandwidth said impedance is predominantly capacitive below a resonant frequency of said frequency dependent negative feedback path.

Preferably, said resonant frequency of said frequency dependent negative feedback path may resonate at a frequency in a radio frequency band.

Suitably, said frequency dependent negative feedback path has an inductive component and a capacitive component. Preferably, said frequency dependent negative feedback path includes a series coupled inductor and capacitor network.

Suitably, in use said voltage controllable variable resonant circuit provides for variations in frequency at said controllable variable frequency output in response to variations in direct current voltages applied at said control input.

Suitably, said voltage controllable variable resonant circuit includes voltage controllable capacitors coupled to said control input. Preferably, said voltage controllable capacitors can be varactors having cathodes directly coupled to each other.

Suitably, said voltage controlled oscillator is configured as a Hartley oscillator.

BRIEF DESCRIPTION OF THE DRAWINGS

In order that the present invention may be readily understood and put into practical affect, reference will now be made to a preferred embodiment illustrated in the accompanying drawings in which.

DETAILED DESCRIPTION OF A PREFERRED EMBODIMENT OF THE INVENTION

Figure 1:
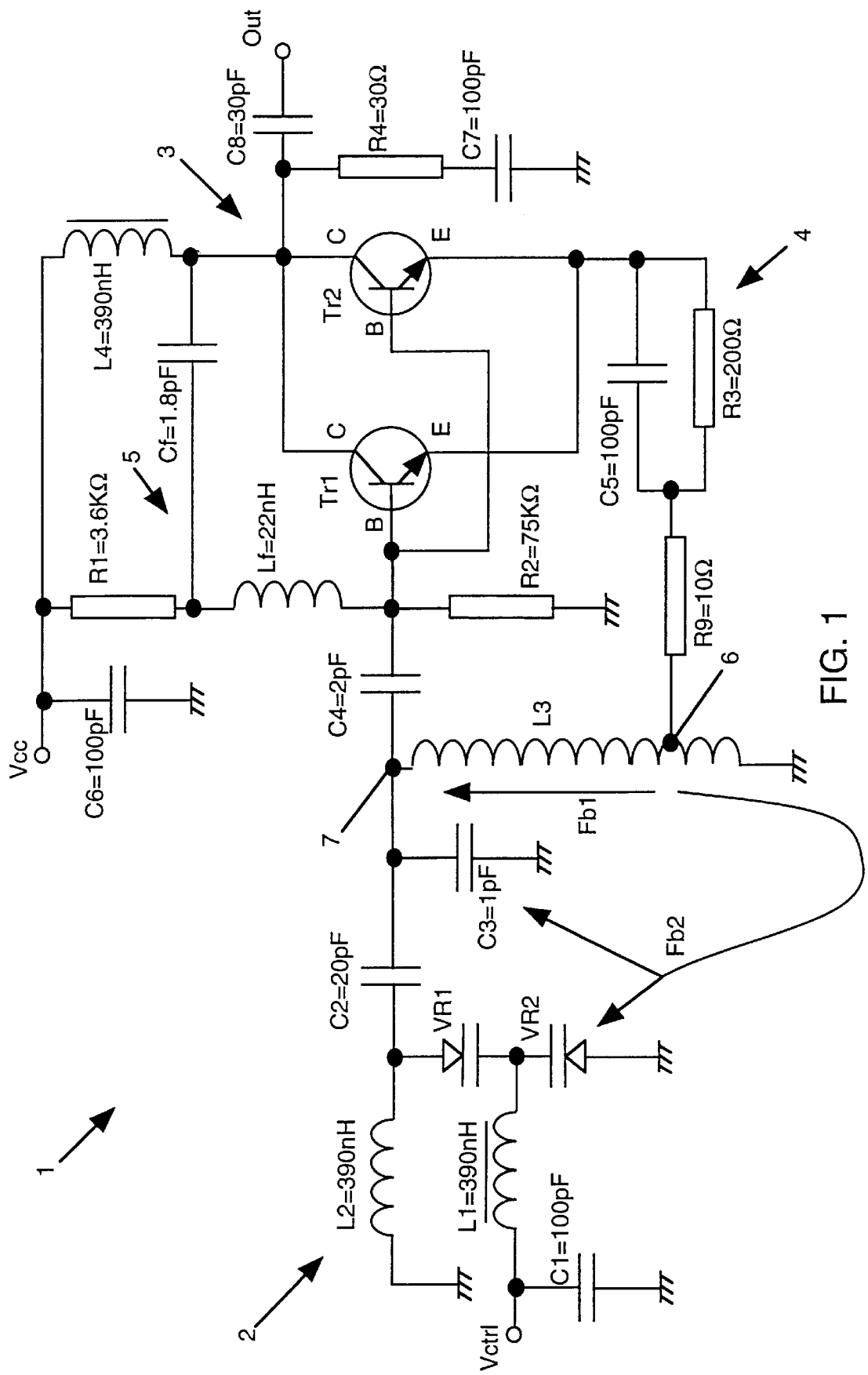
FIG. 1 is a schematic diagram of a voltage controlled oscillator in accordance with a preferred embodiment of the present invention.

Referring to FIG. 1 there is illustrated a Hartley configured voltage controlled oscillator 1 comprising a voltage controllable variable resonant circuit 2, an amplifier 3, a positive feedback path 4 and a frequency dependent feedback path 5.

The voltage controllable variable resonant circuit 2 has a control input Vctrl, which in use is supplied by a Direct Current (D.C.) Voltage, positive feedback input 6 and a controllable variable frequency output 7. The amplifier 3 includes two parallel coupled transistors Tr1 and Tr2, an amplifier input in the form of base electrodes B of the transistors Tr1,Tr2 coupled the controllable variable frequency output 7 by a coupling capacitor C4. The amplifier 3 also includes a positive feedback node in the form of emitter electrodes E of the transistors Tr1,Tr2 and a negative feedback node in the form of collector electrodes of the transistors Tr1,Tr2.

The positive feedback path 4, comprising parallel configured resistor R3 and capacitor C5 in series with a kalty resistor R9, couples the emitter electrodes E to the positive feedback input 6. As will be apparent to a person skilled in the art, the Kalty resistor R9 is for reducing noise that is inversely proportional to frequency (ie 1/f noise). The frequency dependent negative feedback path 5, comprising series configured capacitor Cf and inductor Lf, couples the collector electrodes C to the base electrodes B.

The voltage controllable variable resonant circuit 2 includes a filter capacitor C1 coupling the control input Vctrl to ground. Also coupled to control input Vctrl is one end of a Radio Frequency Choke L1, the other end of which is coupled to a common node of two voltage controllable back-to-back varactors VR1 and VR2 which in this embodiment are contained in a single chip package. This common node is the cathode electrode of each varactor, these electrodes being directly coupled to each other as will be apparent to a person skilled in the art. The anode electrode of varactor VR2 is directly coupled to ground and the anode electrode of varactor VR1 is indirectly D.C. coupled to ground by an RF blocking inductor L2. The voltage controllable variable resonant circuit 2 also includes an inductor L3, one end of which is coupled to the controllable variable frequency output 7. The other end of inductor L3 is coupled to ground and an intermediate part of inductor L3 has a "tap-off" node providing the positive feedback input 6. The controllable variable frequency output 7 is coupled to the anode electrode of varactor Vr1 by a coupling capacitor C2. Further, there is a capacitor C3 coupled to ground and in parallel with inductor L3.

The voltage controlled oscillator 1 also includes a load in the form of a series connected resistor R4 and capacitor C7 coupling the collector electrodes C to ground. There is also a coupling capacitor C8 coupling the collector electrodes C to an output Out of the voltage controlled oscillator 1. The base electrodes B are biased by a potential divider circuit comprising resistors R1 and R2, a common node of which is coupled to the base electrodes B. One end of resistor R2 is coupled to ground and one end of resistor R1 is coupled to a power supply voltage input Vcc. A filter capacitor C6 couples the power supply voltage input Vcc to ground and an RF choke L4 couples the D.C. power supply voltage input Vcc to the collector electrodes.

In use, to stimulate the voltage controlled oscillator 1 into an oscillatory mode, a direct current voltage is applied to VCC (e.g. 5 Volts). Another direct current voltage which may be between 1 volt and 13 volts is applied to the control voltage input Vctrl from a phase-locked loop circuit (not shown).

Background or white noise appearing at the base electrodes B is usually sufficient to stimulate the voltage controlled oscillator 1. A small portion of the amplified noise appearing at the emitter electrodes E is fed back to base electrodes B through a positive feed back path 4 and through some of the components in the voltage controllable variable resonant circuit 2. In this regard, the feedback path splits into two paths at the feedback input 6, these paths being Fb1 and Fb2. This positive feedback occurs due to a first 180 degree phase shift between the base electrodes B and the emitter electrodes E. A second 180 degree phase shift occurs in due to the reactive components of the voltage controllable variable resonant circuit 2. A total of 360 degrees phase shift has therefore occurred and the amplitude of the signal arriving at the base electrodes B is continuously amplified until resistive losses and non-linearities in the transistors Tr1, Tr2 limit the amplitude of the signal. Further, since the amplification of the signal is at a maximum at a resonance frequency (fr) of the reactive components in the voltage controllable variable resonant circuit 2, the voltage controlled oscillator 1 oscillates at this resonance frequency fo.

In use, when a different frequency is required to be generated at the output Out of the voltage controlled oscillator 1, the D.C. voltage level at the control voltage Vctrl is varied. This will affect the capacitance of the varactors VR1 and VR2 and accordingly the resonance frequency (fr) will also be affected resulting in a new frequency at the output Out.

Advantageously, the frequency dependent negative feedback path 5 has the effect of increasing the negative feedback as the frequency at the output Out increases.

In this regard, the frequency dependent negative feedback path 5 has an impedance which decreases in response to an increase in frequency over a desired bandwidth of said voltage controlled oscillator 1. Further, over the desired bandwidth of the voltage controlled oscillator 1 the impedance is predominantly capacitive below a resonant frequency of the frequency dependent negative feedback path 5.

Figure 2:
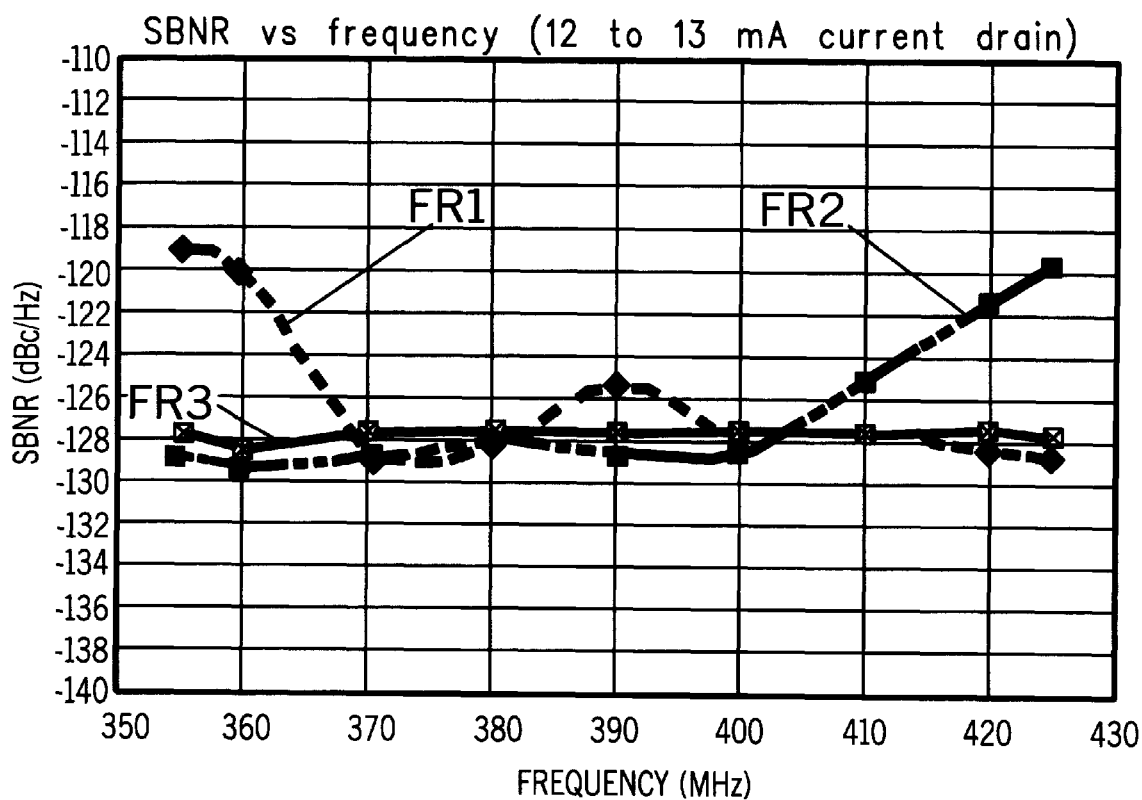
FIG. 2 is a graph showing a SideBand Noise performance of the voltage controlled oscillator of FIG. 1 compared with prior art voltage controlled oscillators.

As illustrated in FIG. 2, the frequency dependent negative feedback path 5 provides a relatively constant SBNR, as indicated by response FR3, across the bandwidth of the voltage controlled oscillator 1. In contrast, conventional Hartley configured voltage controlled oscillators provide the SBNR responses of FR1 or FR2, Accordingly, the present invention provides an economical solution that overcomes or alleviates at least one of the problems associated with the selectivity of adjacent channels of radio frequency wideband voltage controlled oscillators.

Although the invention has been described with reference to a preferred embodiment it is to be understood that the invention is not restricted to the embodiment described herein.

We claim:

1. A voltage controlled oscillator comprising:

a voltage controllable variable resonant circuit having a control input, a positive feedback input and a controllable variable frequency output;

an amplifier having an amplifier input coupled to said controllable variable frequency output, a positive feedback node, a negative feedback node and an oscillator output;

a positive feedback path coupling said positive feedback node to said a positive feedback input; and a frequency dependent negative feedback having a resonant frequency at a frequency in a radio frequency band and a path coupling said negative feedback node to said amplifier input, wherein in use said frequency dependent negative feedback path provides for an increase in negative feedback in response to an increase in frequency over a desired bandwidth of said voltage controlled oscillator.

2. A voltage controlled oscillator as claimed in claim 1, wherein said frequency dependent negative feedback path has an impedance which decreases in response to an increase in frequency over a desired bandwidth of said voltage controlled oscillator.

3. A voltage controlled oscillator comprising:

a voltage controllable variable resonant circuit having a control input, a positive feedback input and a controllable variable frequency output;

an amplifier having an amplifier input coupled to said controllable variable frequency output, a positive feedback node, a negative feedback node and an oscillator output;

a positive feedback path coupling said positive feedback node to said a positive feedback input;

a frequency dependent negative feedback having a resonant frequency at a frequency in a radio frequency band and a path coupling said negative feedback node to said amplifier input, said frequency dependent negative feedback path having an impedance which decreases in response to an increase in frequency over a desired bandwidth of said voltage controlled oscillator; and wherein in use said frequency dependent negative feedback path provides for an increase in negative feedback in response to an increase in frequency over a desired bandwidth of said voltage controlled oscillator; and wherein over the desired bandwidth of said voltage controlled oscillator said impedance is predominantly capacitive.

4. A voltage controlled oscillator comprising:

a voltage controllable variable resonant circuit having a control input, a positive feedback input and a controllable variable frequency output;

an amplifier having an amplifier input coupled to said controllable variable frequency output, a positive feedback node, a negative feedback node and an oscillator output;

a positive feedback path coupling said positive feedback node to said a positive feedback input;

a frequency dependent negative feedback having a resonant frequency at a frequency in a radio frequency band and a path coupling said negative feedback node to said amplifier input, said frequency dependent negative feedback path having an impedance which decreases in response to an increase in frequency over a desired bandwidth of said voltage controlled oscillator; and wherein in use said frequency dependent negative feedback path provides for an increase in negative feedback in response to an increase in frequency over a desired bandwidth of said voltage controlled oscillator; and wherein over the desired bandwidth said impedance is predominantly capacitive below a resonant frequency of said frequency dependent negative feedback path.

5. A voltage controlled oscillator as claimed in claim 2, wherein said frequency dependent negative feedback path has an inductive component and a capacitive component.

6. A voltage controlled oscillator as claimed in claim 1, wherein in use said voltage controllable variable resonant circuit provides for variations in frequency at said controllable variable frequency output in response to variations in direct current voltages applied at said control input.

7. A voltage controlled oscillator as claimed in claim 2, wherein in use said voltage controllable variable resonant circuit provides for variations in frequency at said controllable variable frequency output in response to variations in direct current voltages applied at said control input.

8. A voltage controlled oscillator as claimed in claim 2, wherein said voltage controllable variable resonant circuit includes voltage controllable capacitors coupled to said control input.

9. A voltage controlled oscillator as claimed in claim 2, said voltage controlled oscillator is configured as a Hartley oscillator.

* * * * *